United States Patent [19]

Suzuki

[11] Patent Number: 4,982,256
[45] Date of Patent: Jan. 1, 1991

[54] OPTOELECTRONIC INTEGRATED CIRCUIT

[75] Inventor: Akira Suzuki, Tokyo, Japan

[73] Assignee: NEC Corporation, Tokyo, Japan

[21] Appl. No.: 261,286

[22] Filed: Oct. 24, 1988

[30] Foreign Application Priority Data

Oct. 22, 1987 [JP] Japan ................................ 62-267005

[51] Int. Cl.$^5$ ............................................ H01L 27/14
[52] U.S. Cl. ........................................ 357/30; 357/16; 357/17; 357/41
[58] Field of Search ........................ 357/30, 41, 16, 17

[56] References Cited

U.S. PATENT DOCUMENTS 4,593,304 6/1986 Slayman et al. ...................... 357/30
4,736,231 4/1988 Ayabe et al. .......................... 357/30

FOREIGN PATENT DOCUMENTS 2168528 6/1986 United Kingdom ................. 357/30

Primary Examiner—Edward J. Wojciechowicz
Attorney, Agent, or Firm—Sughrue, Mion, Zinn, Macpeak & Seas

[57] ABSTRACT

An optoelectronic integrated circuit comprises an optical device such as a photodiode and a semiconductor laser provided on a semi-insulating InP substrate and buried except for an operating plane with a high resistance buried layer, and a field effect transistor provided on a strain buffer layer which is provided on the semi-insulating InP substrate. The top surfaces of the optical device and the high resistance buried layer are of the approximately same position levels. Therefore, an optoelectronic integrated circuit is fabricated with a high yield and a high performance.

3 Claims, 2 Drawing Sheets

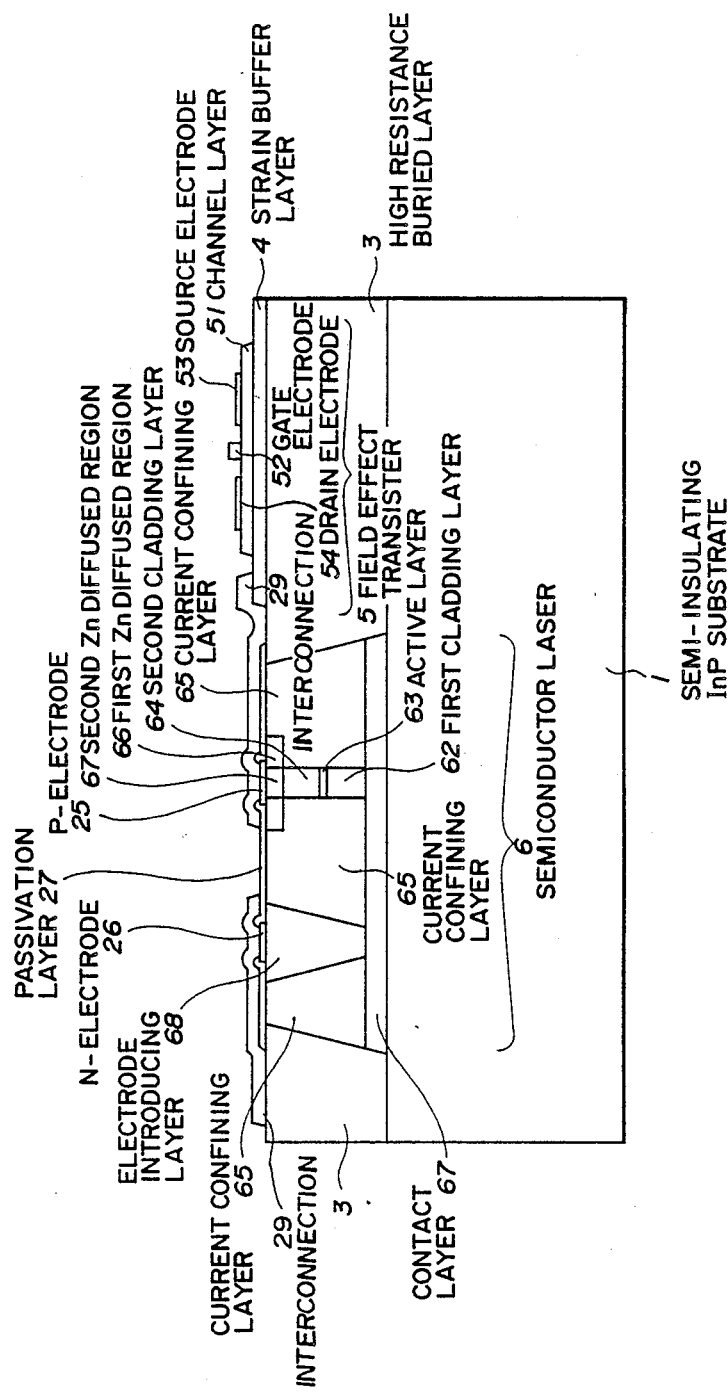

OPTOELECTRONIC INTEGRATED CIRCUIT

FIELD OF THE INVENTION

The invention relates to an optoelectronic integrated circuit, and more particularly to an optoelectronic integrated circuit which is applied to an optical communication system and so on.

BACKGROUND OF THE INVENTION

The scope of an optical communication system has been expanded from a trunk line system to a subscriber system, a local area network system, a data link system etc. in accordance with the progress of an optical communication technology. In order to comply with the highly advanced technology of an optical communication system, optical devices must be of high performance and function.

An optoelectronic integrated circuit is one of key devices which is a nucleus in such an optical communication system. Therefore, research and development of the optoelectronic integrated circuit are focused not only to the basical advantages of circuit integration such as low-cost, compact size, high reliability and non-adjusting maintenance, but also to the improvement of performances such as high speed and high sensitivity, and further to the realization of a device with high and new function which supports a future optical system such as an optical interconnection and an optical switching.

In order to realize such an optoelectronic integrated circuit, a study on composite materials of GaAs system and InP system from which a optimum combination of materials is obtained has been conducted as described on page 215 of "Appl. Phys. Lett. vol. 49. 1986" by M. Razeghi wherein InP system material is for an optical device and GaAs system material is for an electronic device The optoelectronic integrated circuit described therein is of a monolithic integrated circuit including an GaInAs optical device which is grown on a semi-insulating GaAs substrate by the strain heteroepitaxy based on the low pressure MOVPE, and an electronic device which is a GaAs MESFET.

According to the conventional optoelectronic integrated circuit, however, there are disadvantages that a yield in the fabrication thereof is lowered, and that fine and minute process for providing a gate of the MESFET is difficult to be performed, because the difference of horizontal levels is resulted between the optical device and the electronic device for the reason why InP system optical device layer is of a thickness of more than several μm.

SUMMARY OF THE INVENTION

Accordingly, it is an object of the invention to provide an optoelectronic integrated circuit in which the difference of the horizontal levels in a wafer is decreased.

It is a further object of the invention to provide an optoelectronic integrated circuit which is fabricated with a high yield.

It is a still further object of the invention to provide an optoelectronic integrated circuit which is of a high performance.

According to the invention, an optoelectronic integrated circuit comprises an optical device of InP system semiconductor including InGaAs or InGaAsP, and a FET of GaAs system semiconductor including Al-GaAs. The optical device and the FET are integrated in a monolithic state on a semi-insulating InP substrate. The optical device is buried with a high resistance buried layer on the substrate, and the FET is provided on a strain buffer layer which is provided on the high resistance buried layer.

The optical device which is provided on the InP substrate is buried except for a plane portion necessary for operation with the high resistance buried layer such that the plane portion and the high resistance buried layer become flat on the top surface thereof. On the high resistance buried layer, the FET transistor is then provided. This reduces the difference of position levels between the optical device and the FET down to less than 1 μm. As a result, disadvantages that the imperfect interconnection occurred due to the defect of photo-resist pattern at a portion of the position level difference of more than 5 μm in a conventional optoelectronic integrated circuit and that the gate pattern of the FET is defocussed due to the nonuniform thickness of the photo-resist induced in the presence of the position level difference are overcome. Therefore, the optoelectronic integrated circuit according to the invention is obtained with a high yield and a high performance.

BRIEF DESCRIPTION OF DRAWINGS

The invention will be explained in more detail in conjunction with appended drawings wherein, FIG. 2 is a cross sectional view showing an optoelectronic integrated circuit in a second embodiment according to the invention.

DESCRIPTION OF PREFERRED EMBODIMENTS

Figure 1:
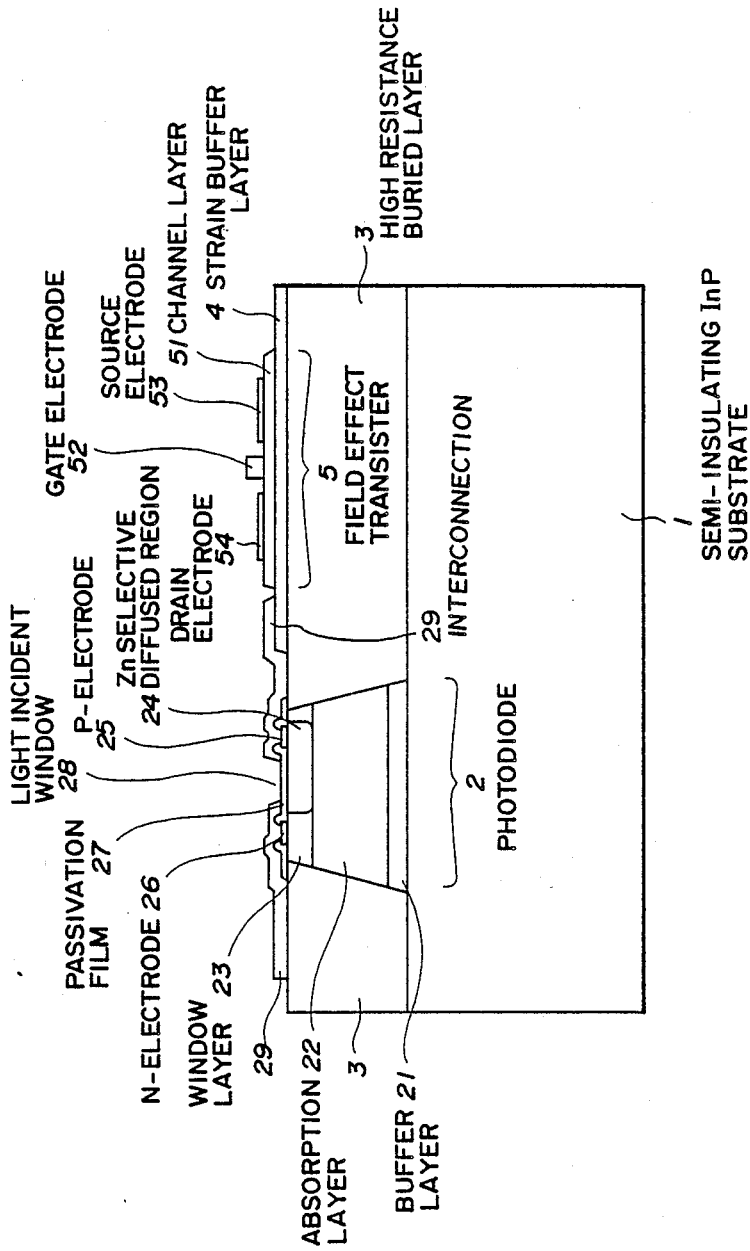
FIG. 1 is a cross sectional view showing an optoelectronic integrated circuit in a first embodiment according to the invention.

In FIG. 1, there is shown an optoelectronic integrated circuit in the first embodiment according to the invention wherein a photodiode 2 is buried with a high resistance buried layer 3 on a semi-insulting InP substrate 1, and an FET 5 is provided on a strain buffer layer 4 which is provided on the high resistance buried layer 3. The photodiode 2 comprises a buffer layer 21 of InP having a thickness of 1 μm and a carrier concentration of $5 \times 10^{18} cm^{-3}$ doped with si, an optical absorption layer 22 of undoped InGaAs having a thickness of 3 μm, a window layer 23 of undoped InP having a thickness of 1 μm, a selectively diffused region 24 diffused with Zn by a thickness of 1 μm, a p-electrode 25 of AuZn having a thickness of 0.1 μm, an n-electrode 26 of AnGeNi having a thickness of 0.1 μm, a passivation film 27 of a $SiN_4$ dielectric film having a thickness of 0.2 μm, a circular light incident window 28 having a diameter of 60 μm, and interconnections 29 of Au having a thickness of 0.5 μm. In the photodiode, each of the semiconductor layers is grown by any one of LPE, VPE, MO-VPE, and MBE processes. On a region where a photodiode structure is selectively etched down to the semi-insulating InP substrate 1 except for a portion of the photodiode 2 by use of a mask of a $SiO_2$ film having a thickness of 3000Å, the high resistance InP doped with Fe is selectively grown in any one of MO-VPE and MBE processes by a thickness of 5 μm. The strain buffer layer 4 of undoped GaAs is grown in MO-VPE process or MBE process by a thickness of 0.5 μm successively after the growth of the high resistance buried layer 3. The FET 5 comprises a channel layer 51 of GaAs having a thickness of 0.2 μm and a carrier concentration of $2\times10^{17}$cm$^{-3}$ doped with Si, a gate electrode 52 of Al having a gate length of 1 μm and a thickness of 0.5 μm, a source electrode 53 of AuGeNi having a thickness of 0.1 μm, and a drain electrode 54 of AuGeNi having a thickness of 0.1 μm. The channel layer 51 is grown in MO-VPE process or MBE process successively after the growth of the strain buffer layer 4. The optoelectronic integrated circuit as shown in FIG. 1 operates as an optoelectronic integrated circuit for receiving light signals.

In FIG. 2, there is shown an optoelectronic integrated circuit in the second embodiment according to the invention. The optoelectronic integrated circuit comprises a semiconductor laser 6 provided on a semi-insulating InP substrate 1 and buried with a high resistance buried layer 3, and an FET 5 provided on a strain buffer layer 4 which is provided on the high resistance buried layer 3. The semiconductor laser 6 comprises a contact layer 61 of InGaAsP having a wavelength composition of 1.1 μm and a carrier concentration of $5\times10^{18}$cm$^{-3}$ doped with Si, a first cladding layer 62 of InP having a thickness of 2 μm, a stripe width of 2 μm, and a carrier concentration of $1\times10^{18}$cm$^{-3}$ doped with Si, and active layer 63 of undoped having a thickness of 0.1 μm, a stripe width of 2 μm, and a wavelength composition of 1.3 μm, a second cladding layer 64 of InP including a second Zn-diffused region 67 having a depth of 0.5 μm diffused with Zn by $1\times10^{18}$cm$^{-3}$ and having a thickness of 2 μm and a stripe width of 2 μm, a current confining layer 65 of InP doped with Fe, with which the first and second cladding layers 62 ad 64 and the active layer 63 are buried, and including a first Zn-diffused region 66 having a depth of 0.5 μm and a width of 4 μm provided thereon, an electrode introducing layer 68 of InP having a stripe width 10 μm and a density of $1\times10^{18}$cm$^{-3}$ doped with Si and buried with the current confining layer 65 to reach the contact layer 61, a p-electrode 25 of AuZn having a thickness of 0.1 μm, an n-electrode 26 of AuGeNi having a thickness of 0.1 μm, a passivation film 27 of Si$_3$N$_4$ having a thickness of 0.2 μm, and interconnections 29 of Au having a thickness of 0.5 μm. In the semiconductor laser, each of the semiconductor layers is grown by any one or a combination of LPE, VPE, MO-VPE, MBE processes, and the constructions of the high resistance buried layer 3, the strain buffer layer 4, and the channel layer 51 are the same as those explained in the first embodiment. The optoelectronic integrated circuit in the second embodiment operates as an optoelectronic integrated circuit for radiating light having a wavelength band of 1.3 μm.

In the first and second embodiments, the gate electrode of the FET is not limited to Al, but may be any material by which Schottky contact is obtained, and the optical device may be an optical functionable element selected from a photodiode, a semiconductor laser, an avalanche photodiode, an optical bistable element, an optical amplifier, an optical switch etc. In the semiconductor laser, the current confining structure is not limited to a specific one, if it has an appropriate property necessary for an optical communication in regard to an oscillation threshold current, a quantum efficiency, a response speed, a reliability and so on. Furthermore, an electronic circuit is not limited to a FET, but it may include a diode, a resistor etc, and the scale of an integration may be larger than that in the embodiments.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An optoelectronic integrated circuit comprising:
   a semi-insulating InP substrate,
   an optical device of an InP system semiconductor which is selected from InGaAs and InGaAsP, and provided on said semi-insulating InP substrate, said optical device having a flat plane on which electrodes are provided to be connected to lead patterns;
   a high resistance buried layer of InP for burying said optical device except for said flat plane, said high resistance buried layer being provided on said semi-insulating InP substrate, and a position level of said high resistance buried layer being equal on its top surface to a position level of said flat plane;
   a strain buffer layer of a material which is selected from GaAs and AlGaAs provided on said top surface of said high resistance buried layer; and
   a field effect transistor of a GaAs system semiconductor including AlGaAs, said field effect transistor being provided on said strain buffer layer and provided with electrodes thereon to be connected to selected ones of said lead patterns.

2. An optical optoelectronic integrated circuit according to claim 1,
   wherein said optical device is a photodiode.

3. An optical optoelectronic integrated circuit according to claim 1,
   wherein said optical device is a semiconductor laser.

* * * * *

UNITED STATES PATENT AND TRADEMARK OFFICE
CERTIFICATE OF CORRECTION

PATENT NO. : 4,982,256
DATED : January 1, 1991
INVENTOR(S) : Akira SUZUKI

It is certified that error appears in the above-identified patent and that said Letters Patent is hereby corrected as shown below:

Col. 1, line 38, after "device" insert --.--.

Col. 3, line 26, after "undoped" insert --InGaAsP--.

Signed and Sealed this

Twenty-second Day of September, 1992

Attest:

Attesting Officer

DOUGLAS B. COMER

Acting Commissioner of Patents and Trademarks